United States Patent
Chu et al.

(10) Patent No.: US 10,600,634 B2
(45) Date of Patent: Mar. 24, 2020

(54) SEMICONDUCTOR SUBSTRATE POLISHING METHODS WITH DYNAMIC CONTROL

(71) Applicant: SunEdison Semiconductor Limited (UEN201334164H), Singapore (SG)

(72) Inventors: Alex Chu, Hsinchu (TW); Hsin-Yi Chi, Hsinchu (TW); Francis Hung, New Taipei (TW); Jones Yang, Zhubei (TW); H. J. Chiu, Taoyuan (TW); J. W. Lu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 15/386,471

(22) Filed: Dec. 21, 2016

(65) Prior Publication Data

US 2017/0178890 A1 Jun. 22, 2017

Related U.S. Application Data

(60) Provisional application No. 62/270,361, filed on Dec. 21, 2015.

(51) Int. Cl.
| | |
|---|---|
| C03C 15/00 | (2006.01) |
| H01L 21/302 | (2006.01) |
| H01L 29/06 | (2006.01) |
| H01L 29/30 | (2006.01) |
| H01L 21/304 | (2006.01) |
| H01L 21/306 | (2006.01) |
| H01L 21/02 | (2006.01) |
| B24B 37/20 | (2012.01) |
| B24B 37/005 | (2012.01) |
| H01L 21/66 | (2006.01) |

(52) U.S. Cl.
CPC ...... *H01L 21/02024* (2013.01); *B24B 37/005* (2013.01); *B24B 37/20* (2013.01); *H01L 21/02019* (2013.01); *H01L 22/20* (2013.01)

(58) Field of Classification Search
CPC ..... B24B 55/02; B24B 37/015; B24B 53/017; B24B 49/14; B24B 37/34; B24B 37/005; B24B 37/044; B24B 37/08; H01L 21/02024; C09G 1/02
See application file for complete search history.

(56) References Cited

U.S. PATENT DOCUMENTS

| | | |
|---|---|---|
| 6,682,405 B2 | 1/2004 | Shimokawa |
| 7,220,676 B2 | 5/2007 | Hagihara et al. |

(Continued)

FOREIGN PATENT DOCUMENTS

| | | | |
|---|---|---|---|
| JP | 2007053298 A | 3/2007 | |
| JP | 2008279553 A | 11/2008 | |

(Continued)

OTHER PUBLICATIONS

M. Kimura et al., "A New Method for the Precise Measurement of Wafer Roll off of Silicon Polished Wafer," Jpn. Jo. Appl. Phys., vol. 38, pp. 38-39 (1999).

(Continued)

*Primary Examiner* — Brian Turner
(74) *Attorney, Agent, or Firm* — Armstrong Teasdale LLP (57) ABSTRACT

Methods for polishing semiconductor substrates are disclosed. The finish polishing sequence is adjusted based on a measured edge roll-off of an analyzed substrate.

17 Claims, 7 Drawing Sheets

(56) References Cited

U.S. PATENT DOCUMENTS

| | | |
|---|---|---|
| 8,192,248 B2 | 6/2012 | Albrecht et al. |
| 2005/0124264 A1* | 6/2005 | Tominaga ............... B24B 37/08 451/41 |
| 2006/0009127 A1* | 1/2006 | Sakurai ................ B24B 37/005 451/5 |
| 2006/0262641 A1* | 11/2006 | Seong .................. B01F 5/0256 366/174.1 |
| 2007/0044386 A1* | 3/2007 | Yamaguchi ............. C09G 1/02 51/308 |
| 2007/0175104 A1* | 8/2007 | Nishiyama .............. C09G 1/02 51/307 |
| 2008/0096474 A1* | 4/2008 | Kato ...................... B24B 9/065 451/57 |
| 2008/0113510 A1* | 5/2008 | Kato ...................... B24B 9/065 438/691 |
| 2009/0223136 A1* | 9/2009 | Nakajo ................... C09G 1/02 51/308 |
| 2010/0081361 A1* | 4/2010 | Fukuda ................ B24B 53/017 451/5 |
| 2011/0039411 A1* | 2/2011 | Moeckel ........... H01L 21/02021 438/691 |
| 2012/0248578 A1* | 10/2012 | Masuda ............ H01L 21/02002 257/618 |
| 2013/0023186 A1* | 1/2013 | Motoshima ............. B24B 55/02 451/7 |
| 2013/0032573 A1* | 2/2013 | Ogata ..................... B24B 37/08 216/53 |
| 2013/0109180 A1* | 5/2013 | Tanimoto ............. B24B 37/042 438/692 |
| 2014/0162456 A1 | 6/2014 | Oba et al. |
| 2014/0206261 A1 | 7/2014 | Roettger et al. |
| 2014/0273748 A1 | 9/2014 | Bhagavat et al. |
| 2017/0015868 A1* | 1/2017 | Iwata ................... C09K 3/1409 |

FOREIGN PATENT DOCUMENTS

| | | |
|---|---|---|
| JP | 5450946 B2 | 3/2014 |
| KR | 20040056177 A | 6/2004 |
| KR | 20080062020 A | 7/2008 |
| WO | 2016060872 A2 | 4/2016 |

OTHER PUBLICATIONS

SEMI M69: Practice for Determining Wafer Near-Edge Geometry using Roll-off Amount, ROA (Preliminary) (2007).

* cited by examiner

SEMICONDUCTOR SUBSTRATE POLISHING METHODS WITH DYNAMIC CONTROL

CROSS-REFERENCE TO RELATED APPLICATION

This application claims the benefit of U.S. Provisional Patent Application No. 62/270,361, filed Dec. 21, 2015, which is incorporated herein by reference it its entirety.

FIELD OF THE DISCLOSURE

The field of the disclosure relates to methods for polishing semiconductor substrates and, in particular, methods that involve adjusting the finish polishing sequence based on a measured edge roll-off of an analyzed substrate.

BACKGROUND

Semiconductor wafers are commonly used in the production of integrated circuit (IC) chips on which circuitry are printed. The circuitry is first printed in miniaturized form onto surfaces of the wafers. The wafers are then broken into circuit chips. This miniaturized circuitry requires that front and back surfaces of each wafer be extremely flat and parallel to ensure that the circuitry can be properly printed over the entire surface of the wafer. To accomplish this, grinding and polishing processes are commonly used to improve flatness and parallelism of the front and back surfaces of the wafer after the wafer is cut from an ingot. A particularly good finish is required when polishing the wafer in preparation for printing the miniaturized circuits on the wafer by an electron beam-lithographic or photolithographic process (hereinafter "lithography"). The wafer surface on which the miniaturized circuits are to be printed must be flat.

Polishing processes may cause the profile of the semiconductor wafer to change near the edge of the structure due to an uneven distribution of mechanical and/or chemical forces near the edge. For example, the thickness profile at the peripheral edge of the structure may be reduced, i.e., "edge roll-off" may be observed. Edge roll-off reduces the portion of the wafer available for device fabrication.

There is a need for methods for polishing semiconductor substrates that improve substrate flatness and/or surface roughness while minimizing edge roll-off.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for polishing a semiconductor substrate having a front surface and a back surface generally parallel to the front surface. The method includes analyzing a semiconductor substrate to measure the edge roll-off of the semiconductor substrate. The front surface of the semiconductor substrate or a different semiconductor substrate is contacted with a polishing pad to polish the front surface. A polishing slurry is supplied to the polishing pad. An amount of the polishing slurry supplied to the polishing pad is controlled based on the measured edge roll-off.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for polishing semiconductor substrates. Suitable substrates (which may also be referenced herein as semiconductor "wafers" or "structures") include single crystal silicon substrates including substrates obtained by slicing the wafers from ingots formed by the Czochralski process. Each substrate includes a central axis, a front surface and a back surface parallel to the front surface. The front and back surfaces are generally perpendicular to the central axis. A circumferential edge joins the front and back surfaces and a radius extends from the central axis to the circumferential edge. The structure polished according to methods of the present disclosure may be any diameter suitable for use by those of skill in the art including, for example, 200 mm, 300 mm, greater than 300 mm or even 450 mm diameter wafers.

In one or more embodiments of the present disclosure, a first polishing step is performed in which the front surface and optionally the back surface of the structure are polished (i.e., a double-side polish is performed). Generally, the polish is a "rough" polish that reduces the surface roughness of the wafer to less than about 3.5 Å to even as low as about 2.5 Å or even about 2 Å as measured with an atomic force microscope (AFM) at scan sizes of about 1 μm×about 1 μm to about 100 μm×about 100 μm. For purposes of this specification, surface roughness is expressed as the root mean square (RMS) unless indicated otherwise. Rough polishing typically results in removal of about 1 μm to about 20 μm and, more typically, from about 5 μm to about 15 μm of material from the surface of the wafer.

The rough polish (and the finish polish described below) may be achieved by, for example, chemical-mechanical planarization (CMP). CMP typically involves the immersion of the wafer in an abrasive slurry and polishing of the wafer by a polymeric pad. Through a combination of chemical and mechanical action the surface of the wafer is smoothed. Typically the polish is performed until a chemical and thermal steady state is achieved and until the wafers have achieved their targeted shape and flatness. The rough polish may be performed on a double-side polisher commercially available from Peter Wolters (e.g., AC2000 polisher; Rendsburg, Germany) or Fujikoshi (Tokyo, Japan), Speedfam (Kanagawa, Japan). Stock removal pads for silicon polishing are available from Psiloquest (Orlando, Fla.) and Dow Chemical Company (Midland, Mich.) and silica based slurries may be purchased from Dow Chemical Company, Cabot (Boston, Mass.), Nalco (Naperville, Ill.), Bayer MaterialScience (Leverkusen, Germany), DA NanoMaterials (Tempe, Ariz.) and Fujimi (Kiyoso, Japan).

The rough polishing step may occur for about 300 seconds to about 60 minutes and at a pad pressure of from about 150 g/cm$^2$ to about 700 g/cm$^2$ with a slurry flow rate of about 50 ml/min to about 300 ml (or from about 75 ml/min to about 125 ml/min). However, it should be understood that other polish times, pad pressures and slurry flow rates may be used without departing from the scope of the present disclosure.

After the rough polish is complete, the wafers may be rinsed and dried. In addition, the wafers may be subjected to a wet bench or spin cleaning. Wet bench cleaning may include contacting the wafers with SC-1 cleaning solution (i.e., ammonium hydroxide and hydrogen peroxide), optionally, at elevated temperatures (e.g., about 50° C. to about 80° C.). Spin cleaning includes contact with a HF solution and ozonated water and may be performed at room temperature.

After cleaning, a second polishing step may be performed. The second polishing step is typically a "finish" or "mirror" polish in which the front surface of the substrate is contacted with a polishing pad attached to a turntable or platen. The finish polish reduces the surface roughness of the wafer to less than about 2.0 Å as measured by an AFM at scan sizes of about 10 µm×about 10 µm to about 100 µm×about 100 µm. The finish polish may even reduce the surface roughness to less than about 1.5 Å or less than about 1.2 Å at scan sizes of about 10 µm×about 10 µm to about 100 µm×about 100 µm. Finish polishes typically remove only about 0.5 µm or less of material from the surface.

Figure 1:
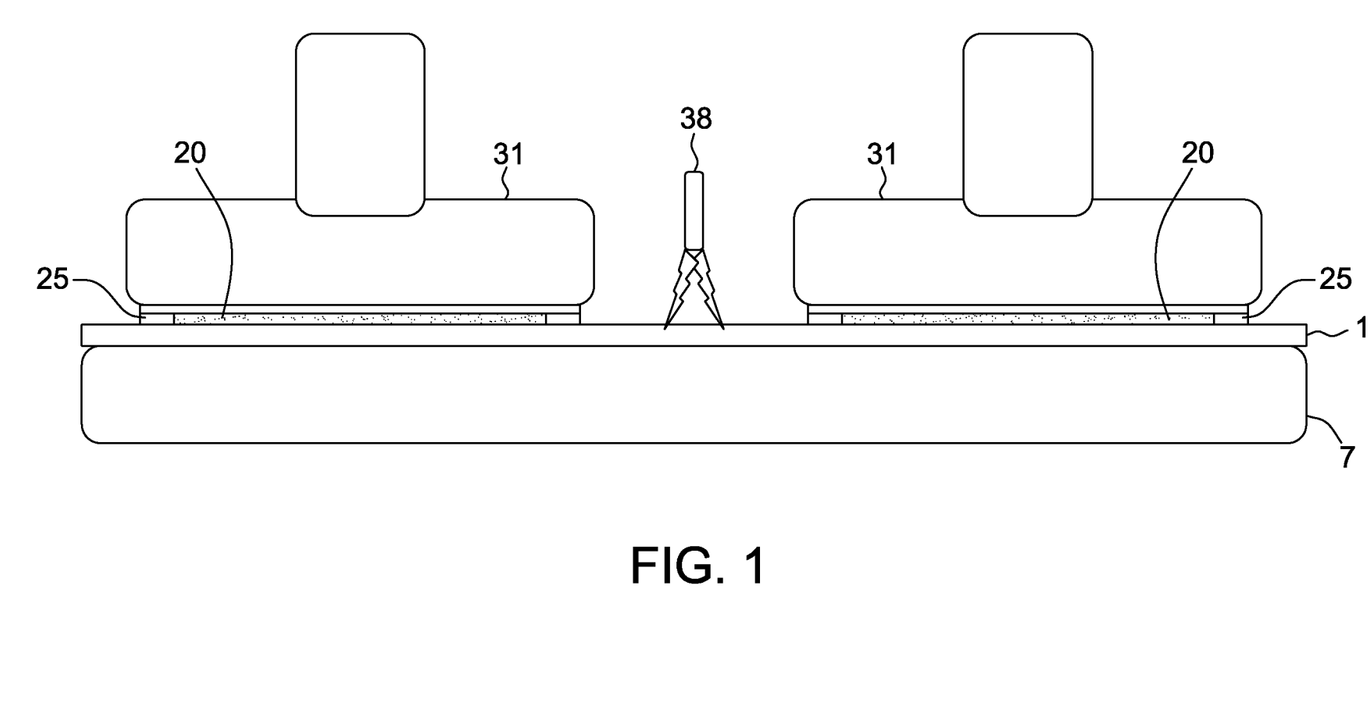
FIG. 1 is a schematic of a finish polishing apparatus.

With reference to FIG. 1, suitable finish polishing apparatus may include a polishing pad 1 that is mounted to a polishing table 7. Polishing heads 31 hold substrates 20 by use of retainers 25 such that the front surfaces of the substrates 20 contact the pad 1. Slurry 38 is supplied to the polishing pad 1. The polishing head 31 oscillates at high speed to move the substrates 20 relative to the pad 1 to polish the front surfaces of the substrates.

Suitable polishers for finish polishing may be obtained from Lapmaster SFT (e.g., LGP-708, Chiyoda-Ku, Japan). Suitable pads include polyurethane impregnated polyethylene pads such as SUBA pads available from Dow Chemical Company, suede-type pads (also referred to as a polyurethane foam pad) such as a SURFIN pad from Fujimi, a CIEGAL pad from Chiyoda KK (Osaka, Japan) and a SPM pad from Dow Chemical Company.

The finish polish (i.e., first table of the finish polish) may occur for at least about 60 seconds or even about 90, 120 or 180 seconds. The total slurry flow rate may range from about 500 ml/min to about 1000 ml/min (total as mixed) and the pad pressure may range from about 60 g/cm$^2$ to about 200 g/cm$^2$; however, it should be understood that other polish times, pad pressures and slurry flow rates may be used without departing from the scope of the present disclosure.

The finish polish may involve several polishing steps. For example, the structure may be exposed to a several separate polishing sequences at two or more tables of a finish polisher (i.e., different workstations at which a different polishing pad is used). The polishing slurry supplied to the polishing pad at a table may also be varied during a polishing sequence.

One or more polishing slurries may be supplied to the polishing pad at various sequences at the first table (i.e., first polishing pad) of the polishing apparatus. In accordance with embodiments of the present disclosure, suitable slurries that may be used alone or in combination in the polishing sequences include a first polishing slurry comprising an amount of silica particles, a second polishing slurry also comprising an amount of silica particles but at a concentration less than the first slurry, a third polishing slurry that is alkaline (i.e., caustic) and typically does not contain silica particles and a fourth polishing slurry that is deionized water. In this regard, it should be noted that the term "slurry" as referenced herein denotes various suspensions and solutions (including solutions without particles therein such as caustic solution and deionized water) and is not intended to imply the presence of particles in the liquid.

The silica particles of the first and second slurries may be colloidal silica and the particles may be encapsulated in a polymer. Suitable first silica-containing polishing slurries include Syton-HT50 (Du Pont Air Products NanoMaterials; Tempe, Ariz.). Suitable second silica-containing polishing slurries include Glanzox-3018 from (Fujimi; Tokyo, Japan) and NP 8020 (Nitta Haas; Osaka, Japan).

The concentration of silica in the first and second polishing slurries may be varied by using less of silica particles in the second slurry. More typically, the concentration is varied by using silica particles that include less silicon in the particles themselves (i.e., more polymer encapsulation and less silica).

In some embodiments, the first polishing slurry contains a first set of silica particles and the second slurry contains a second set of silica particles. The first set of silica particles has a silica content of $X_1$ and the second set has a silica content of $X_2$ with $X_1$ being greater than $X_2$. The silica content of the particles may be varied by individually encapsulating the particles of at least one set with a polymer with the degree of encapsulation (i.e., thickness of polymer) being different between the two sets. The polymer reduces the silica content within the set of particles. In some embodiments, the ratio of $X_1$ to about $X_2$ is at least about 2:1 or even at least about 3:1, at least about 5:1, at least about 10:1 or even at least about 15:1. The difference between $X_1$ and about $X_2$ (i.e., $X_1$ minus $X_2$) may be about 5 wt %, at least about 10 wt %, at least about 25 wt % or at least about 50 wt %.

In some embodiments, the silica particles of the first set of the first polishing slurry are individually encapsulated in a polymer and the first set includes at least about 50 wt % silica or at least about 60 wt %, at least about 70 wt %, from about 50 wt % to about 95 wt %, from about 60 wt % to about 95 wt % or from about 70 wt % to about 90 wt % silica.

The second set of silica particles of the second polishing slurry may also be individually polymer encapsulated. The second set of polymer-encapsulated silica particles may comprise less than about 25 wt % silica or, as in other embodiments, less than about 15 wt %, less than about 10 wt %, from about 1 wt % to about 25 wt %, from about 1 wt % to about 15 wt % or from about 1 wt % to about 10 wt % silica.

The third polishing slurry is alkaline (e.g., comprises KOH, NaOH or a $NH_4$ salt) and, typically, does not contain silica particles. The slurry may have a pH of greater than 12 (e.g., a pH from about 13 to about 14).

The first, second, third and fourth polishing slurries may be applied alone or in various combinations in various polishing sequences. In an exemplary sequence and according to some embodiments of the present disclosure, finish polishing at the first table of the finish polisher begins with a first finish polishing step in which the polishing pad is concurrently contacted with the first polishing slurry comprising silica and the third polishing slurry which is alkaline. The two slurries may be combined at the polisher (i.e., supplied separately at the pad) or may be mixed before being supplied to the pad.

In a second finish polishing step of the first table, the second silica-containing polishing slurry and the third alkaline polishing slurry are concurrently supplied to the polishing pad. The fourth slurry comprising deionized water may be used in addition or as an alternative to the third slurry that is alkaline in the second step. Generally, the second polishing slurry is supplied to the pad only after the first polishing slurry has been fully supplied in the first step.

In a third finish polishing step of the first table, the second polishing slurry comprising silica particles and/or the fourth polishing slurry comprising deionized water are supplied to the polishing pad. Generally, the third slurry does not include alkaline to prevent the formation of etching pits.

After the polishing sequences of the first table are complete, the semiconductor substrate may be transferred to a second or even a third table. The second and third tables may include the same or different polishing pads than that of the first table. The second polishing slurry that has a lower concentration of silica than the first slurry and/or the fourth slurry comprising deionized water may be used at the second and third tables.

In accordance with embodiments of the present disclosure, a substrate that has been rough polished but not finish polished is analyzed by measuring the edge roll-off of the structure to provide feedback to adjust the polishing sequences of the first table of the finish polisher. The substrate is analyzed to determine the edge roll-off (also referred to as "roll-off amount" or simply "ROA").

Edge roll-off may be measured using the height data profile as disclosed by M. Kimura et al., "A New Method for the Precise Measurement of Wafer Roll off of Silicon Polished Wafer," *Jpn. Jo. Appl. Phys.*, vol. 38, pp. 38-39 (1999), which is incorporated herein by reference for all relevant and consistent purposes. Generally, the methods of Kimura have been standardized by the industry as by, for example, SEMI M69: Practice for Determining Wafer Near-Edge Geometry using Roll-off Amount, ROA (Preliminary) (2007) which is also incorporated herein by reference for all relevant and consistent purposes. Most commercially available wafer-inspection instruments are pre-programmed to calculate ROA. For instance ROA may be determined by use of a KLA-Tencor Wafer Inspection System using Wafer-Sight analysis hardware (Milpitas, Calif.).

Figure 2:
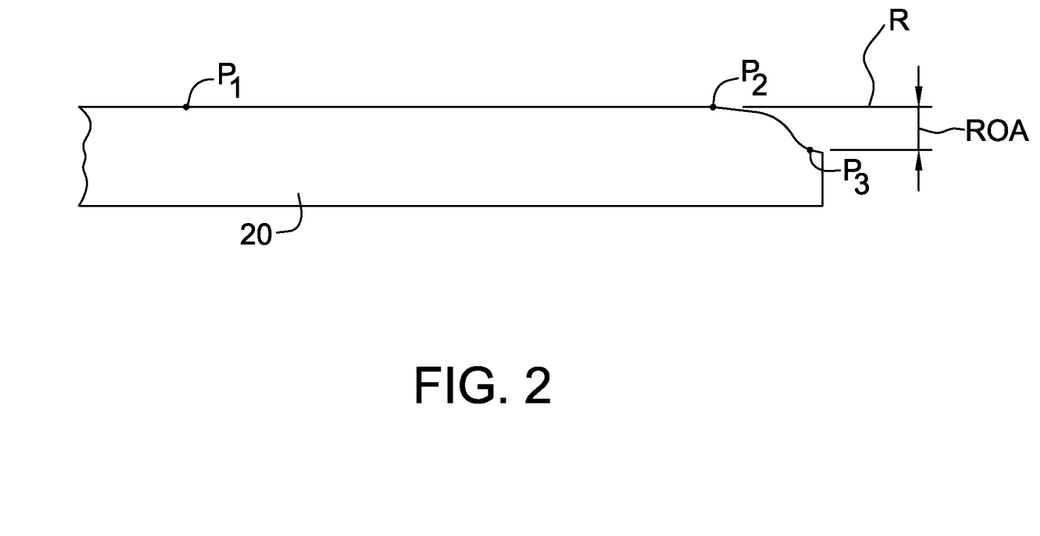
FIG. 2 is a cross-section view of a wafer schematically showing measurement of the roll-off amount.

With reference to FIG. 2, ROA of a wafer 20 is generally determined by reference to three points ($P_1$, $P_2$ and $P_3$) along a wafer radius. A reference line R is fitted between two points ($P_1$, $P_2$). The third point ($P_3$) is near the circumferential edge of the wafer where roll-off is conventionally observed. The ROA is the distance between the reference line R and the third point $P_3$. The reference line R may be fitted as a first order linear line or a third order polynomial. For purposes of the present disclosure, the reference line is fitted as a first order linear line unless stated differently.

In this regard, ROA may be expressed in terms of front surface ROA, back surface ROA or thickness ROA (i.e., using an average thickness profile). Front surface ROA and back surface ROA measurements involve fitting a best-fit reference line R between $P_1$ and $P_2$ along the respective front or back surface and thickness ROA involves fitting a best fit line for the various wafer 20 thicknesses between $P_1$ and $P_2$ (i.e., the thickness ROA takes into account both the front and back surface).

While any of three points may be chosen to determine ROA, one common method used in the art, particularly for 300 mm substrates, includes using a first point that is about 80% of the radius of the wafer from the central axis of the wafer and a second point that is about 93.3% of the radius from the central axis of the wafer to form the reference line R. These points are about 120 mm and 140 mm from the central axis of the wafer in a 300 mm diameter wafer. A third point about 98.7% of the radius of the wafer from the central axis (i.e., at about 148 mm from the central axis for a 300 mm diameter wafer) may be used with the distance between the reference line and the third point being ROA. The ROA may also be determined using a third point that is about 98.0% of the radius of the wafer from the central axis or about 99.3% of the radius of the wafer from the central axis (about 147 mm and about 149 mm respective for 300 mm diameter wafers).

ROA may be measured across several radii of the wafer and averaged. For instance, the ROA of 2, 4 or 8 radii angularly spaced across the wafer may be measured and averaged. For instance, ROA may be measured by averaging the ROA of eight radii (e.g., the eight radii at 0°, 45°, 90°, 135°, 180°, 225°, 275° and 315° in the R-θ coordinate system as described in SEMI M69).

As described above, the ROA measurement may involve the front surface profile, back surface profile or thickness profile. In this regard, "ROA" as used herein refers to the ROA measured by use of the best-fit thickness profile (i.e., thickness ROA rather than a front surface ROA) of the wafer with a linear first order line being established between 80% and 93.3% of the radius of the wafer and with the reference point in the annular edge portion of the wafer being at 98.7% of the radius, unless stated otherwise.

It should be understood that ROA, in regard to the thickness profile, may be a positive number in which the wafer becomes thicker in its peripheral edge portion or may be a negative number in which the wafer becomes less thick in its peripheral edge portion. In this regard, use of the phrase "less than" herein in relation to an ROA amount (either negative or positive) indicates that the ROA is in a range from the recited amount to about 0 (e.g., an ROA of "less than about −700 nm" refers to an ROA range of about −700 nm to about 0 and an ROA of "less than about 700 nm" refers to an ROA in the range of about 700 nm to about 0). Additionally, use of the phrase "greater than" in relation to an ROA amount (either negative or positive) includes roll-off amounts in which the edge portion of the wafer is further away from the axial center of the wafer than the recited amount.

It should also be noted that reference to a "delta ROA/ERO" (see FIGS. 4 and 6) references the change in ROA from a previous process condition. For negative ROA's (e.g., −700 nm) in which fall-off is observed at the edge, a positive delta ROA/ERO indicates an improvement in the edge roll-off (i.e., the edge did not fall off as much) in the changed condition while a negative delta ROA/ERO indicates additional fall-off at the edge. For positive ROA's (e.g., 700 nm) in which an up-tick is observed at the edge, a positive delta ROA/ERO indicates a further uptick at the edge for the changed condition while a negative delta ROA indicates less of an uptick at the edge for the changed condition.

Once a semiconductor substrate is analyzed by measuring the edge roll-off, the measured edge roll-off may be used to adjust the polishing sequence of the first table of the finish polisher. The measured edge roll-off may be used to adjust the polishing sequence for the semiconductor structure that was analyzed or may be used to adjust the polishing sequence for that structure and several additional structures (e.g., a wafer of a batch of wafers is analyzed to adjust the polishing sequence for the entire batch). For example, 100 or less substrates may be polished for every substrate that is analyzed by measuring the edge roll-off or 25 or less or 10 or less substrates may be polished for every substrate analyzed.

After the semiconductor substrate is analyzed by measuring the edge roll-off, the amount of the first polishing slurry supplied to the polishing pad may be controlled to adjust the edge roll-off that occurs during the polishing process, particularly at the first table. In some embodiments, the first polishing slurry volume supplied at the first table (i.e., the sum of each polishing step at the first table) is controlled to adjust the edge roll-off. Suitably, a ratio of the first polishing slurry volume supplied at the first table to the second polishing slurry volume supplied at the first table may be adjusted. As shown in Example 2 below, by decreasing the amount of first silica-containing polishing slurry supplied relative to the second silica-containing slurry, the edge roll-off that occurs during the finish polish is reduced (i.e., a negative ROA which would indicate the presence of roll-off at the edge is made less negative). The amount of alkaline polishing slurry supplied at the first table of the finish polisher may be increased based on a measured increase in the edge roll-off of the analyzed substrate (i.e., a measured increase in the fall-off at the edge of the wafer). The ratio of the first polishing slurry volume supplied at the first table to the second polishing slurry volume supplied at the first table may be decreased based on a measured increase in the edge roll-off of the analyzed substrate (i.e., a measured increase in the fall-off at the edge of the wafer). In some embodiments, the ratio is adjusted by reducing the length of time at which the first silica-containing slurry is supplied to the polishing pad.

Alternatively or in addition to adjusting the ratio of the first and second silica-containing polishing slurries, the amount of the third alkaline polishing slurry added at the first table (i.e., the total sum of alkaline added at the first table during each polishing step) is adjusted based on the measured edge roll-off of the analyzed wafer. In some embodiments, the amount of the third alkaline polishing slurry added concurrently with the second silica-containing polishing slurry is controlled to adjust edge roll-off. As shown in Example 3 below, by increasing the amount of alkaline added during the first table of the finish polisher, the edge roll-off that occurs during the finish polish is reduced (i.e., a negative ROA which would indicate the presence of roll-off at the edge is made less negative). The amount of alkaline polishing slurry supplied at the first table of the finish polisher may be increased based on a measured increase in the edge roll-off of the analyzed substrate (i.e., a measured increase in the fall-off at the edge of the wafer).

In some embodiments, a target edge roll-off is determined and the process conditions (e.g., amount of first polishing slurry containing silica and/or the amount of alkaline third polishing slurry) are adjusted based on the deviation from the target edge roll-off in the analyzed structure. In addition to edge roll-off measurement, the feedback control methods may also involve evaluation of other parameters such as the wafer flatness and controlling the polishing parameters such that improved edge roll-off may be achieved without unacceptable degradation of the wafer flatness. Other parameters may be monitored to ensure quality processing (e.g., presence of etching pits).

As compared to conventional methods for polishing substrates, methods of the present disclosure have several advantages. By measuring the edge roll-off of a sample substrate in a batch of substrates to determine variation in the edge roll-off of rough-polished substrates, the polishing process may be adjusted to increase or decrease the edge roll-off so as to produce substrates having an improved and more consistent edge roll-off. The edge roll-off may be adjusted dynamically within the finish polish sequence by reducing or increasing the amount of polishing slurry containing silica or an alkaline polishing slurry. The methods may be particularly useful to reduce the edge roll-off in single-side polishing processes in which no more than about 0.5 µm or less of material is removed from the surface of the structure (which is typical of polishing of 300 mm diameter wafers).

EXAMPLES

The processes of the present disclosure are further illustrated by the following Examples. These Examples should not be viewed in a limiting sense.

Example 1

Effect of Varying Amounts of First and Second Silica Slurries on Removal Profile in Finish Polish Rough, double-side polished wafers were finish polished in a single-side polisher. In a first polishing step of the first table of the final polishing apparatus, a first polishing slurry comprising silica particles (Syton-HT50) and an amount of alkaline polishing slurry (KOH) were supplied to the polishing pad. In a second step, a second polishing slurry comprising silica particles (mixture of Glanzox-3018 and NP 8020) and alkaline were supplied to the table. The second silica-containing slurry contained less silica than the first silica-containing slurry. In a third step, the second silica-containing slurry and deionized water were supplied to the pad.

The wafers were transferred to a second table and subsequently to a third table. In both the second and third tables, the second silica-containing polishing slurry and deionized water were supplied to the pads.

Figure 3:
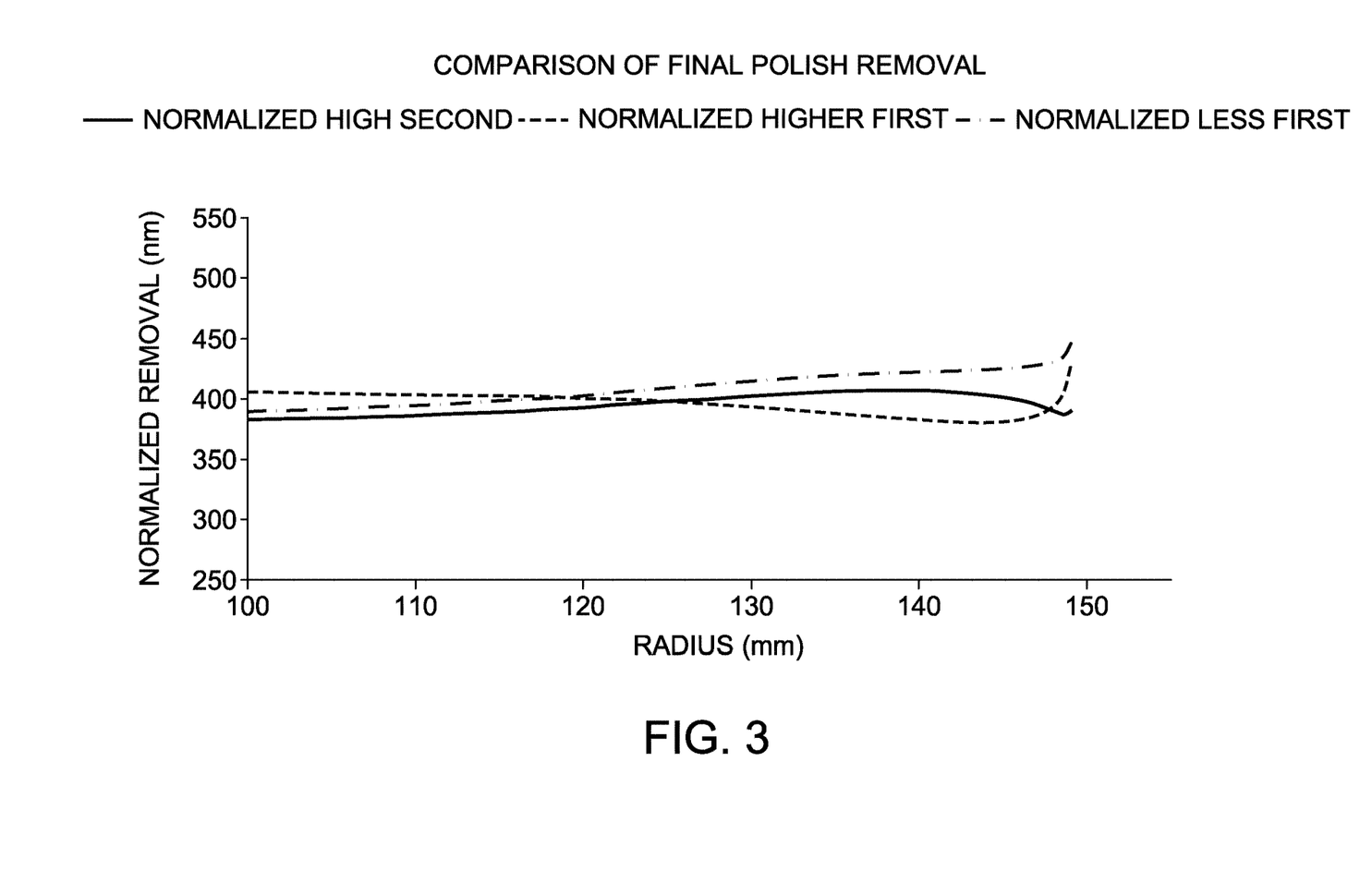
FIG. 3 is a graph of the change in the amount of material removed across the wafer radius for different finish polish conditions.

The amount of the first and second silica-containing slurries was varied from the conventional polishing method for several runs of wafers. Normalized removal for the various runs was measured after processing at the first, second and third tables. As shown in FIG. 3, use of additional first slurry resulted in an increase of removal at the edge (an increase in edge roll-off). Use of less first slurry also resulted in an increase in removal at the edge of the wafer. However, the change in removal (i.e., degree of removal near 148 mm as compared to a fitted line showing the change in removal toward the edge) was greater when additional first slurry was used which indicates a higher edge roll-off with increased first slurry. Use of additional second slurry resulted in less removal toward the edge of the wafer and reduced roll-off.

Example 2

Effect of Varying First Silica-Containing Slurry in Finish Polish

Figure 4:
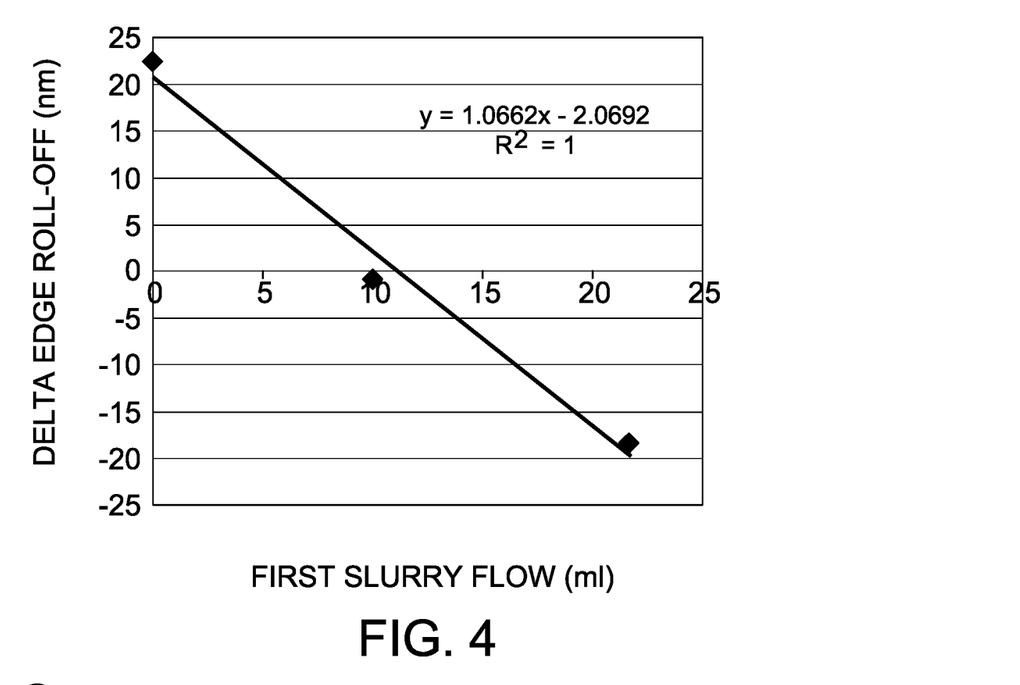
FIG. 4 is a graph of the change in the edge roll-off of finish polished wafers when varying the amount of the first silica-containing polishing slurry.

The polishing process of Example 1 was performed while adjusting the total flow of the first silica-containing polish at the first table of the finish polisher. FIG. 4 shows the change in edge roll-off (measured at 148 mm) before and after the finish polish (finish ROA minus rough ROA). As shown in FIG. 4, use of small volumes of the first silica containing polishing lessens the edge roll-off (i.e., negative ROA becomes less negative). This improvement lessens with additional volume of the first silica-containing polishing slurry. Volumes to the right of the intersection with the x-axis indicate an increase in edge roll-off caused by use of additional first slurry.

Figure 5:
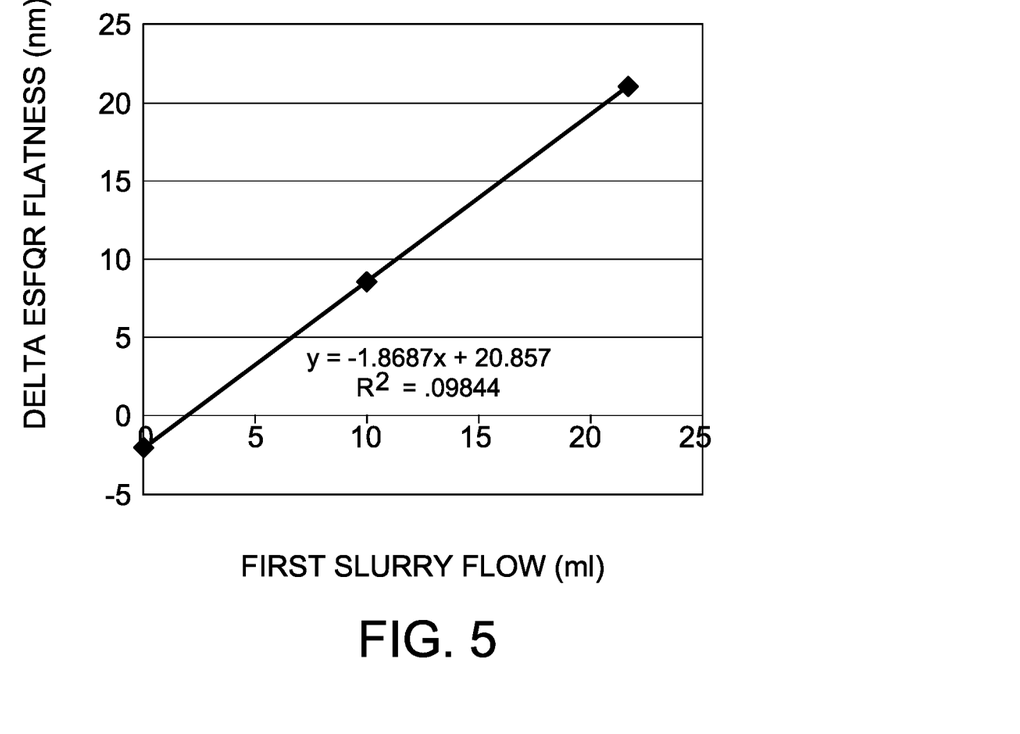
FIG. 5 is a graph of the change in the near edge flatness of finish polished wafers when varying the amount of the first silica-containing polishing slurry.

FIG. 5 shows the change in near-edge flatness (ESFQR) for the wafers. As shown in FIG. 5, the near-edge flatness degrades with use of additional volume of the first silica-containing polishing slurry at the first table of the finish polisher.

Example 3

Effect of Varying Amount of Alkaline in Finish Polish

The ratio of the amount of alkaline to the amount of second silica containing slurry in the second polishing step of the first table of the finish process described in Example 1 was varied. The edge roll-off (measured at 148 mm) of the wafers were measured after the finish polish.

Figure 6:
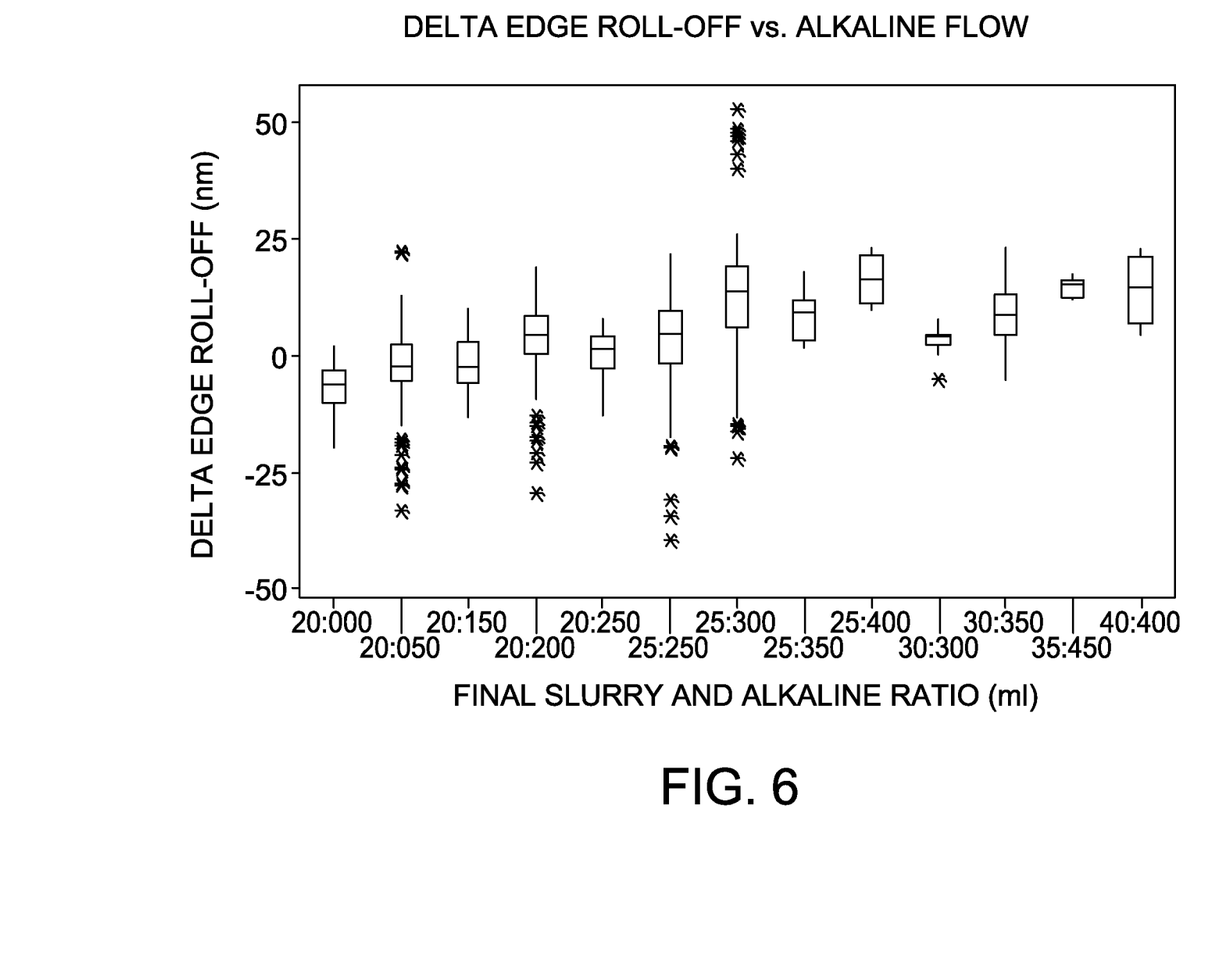
FIG. 6 is a box-plot of the change in the edge roll-off of finish polished wafers when varying the amount of alkaline polishing slurry.

A box-plot of the results is shown in FIG. 6. As shown in FIG. 6, at a second silica-containing slurry amount of 20 ml (first 5 data points), the edge roll-off improved with increasing amounts of alkaline. This is also seen in the 25 ml second silica-containing slurry data points.

Example 4

Production Runs with Dynamic Slurry Control

Figure 7:
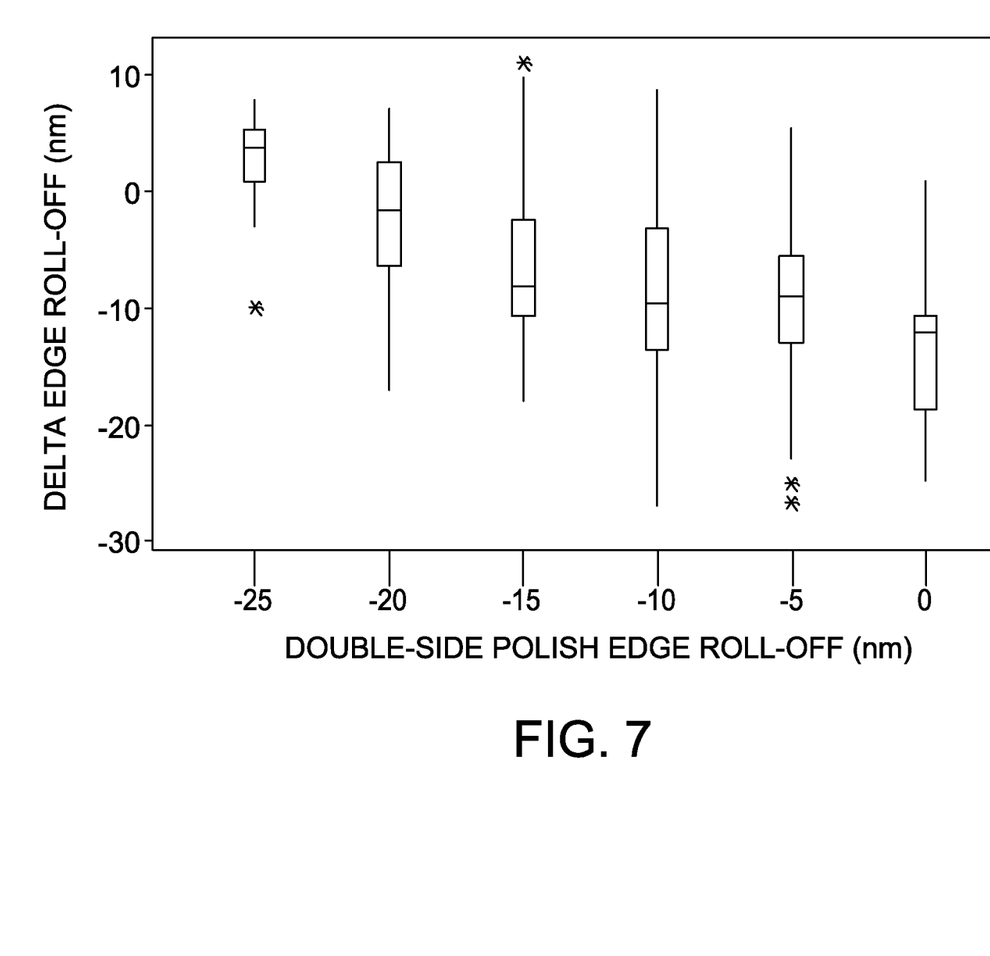
FIG. 7 is a box-plot of the change in edge roll-off of finish polished wafers with dynamic slurry control.
Figure 8:
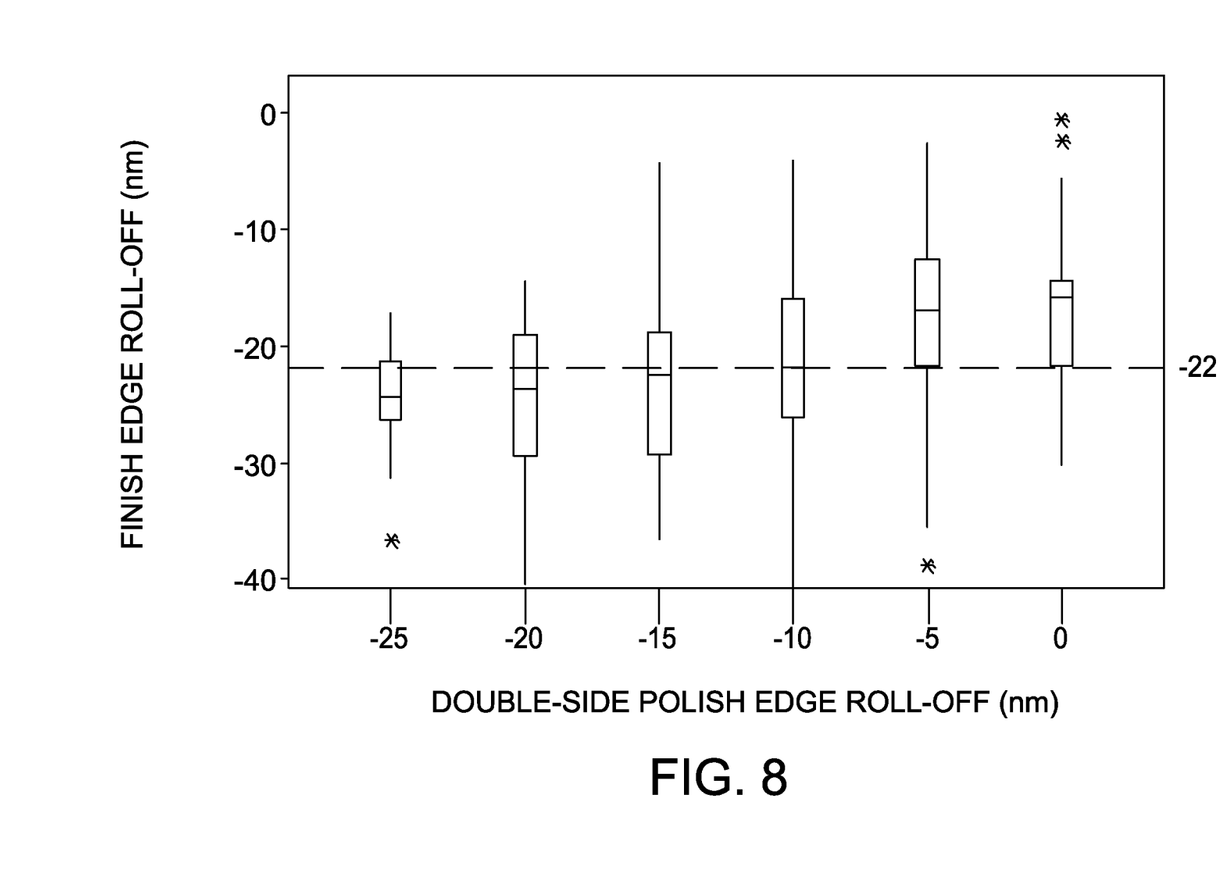
FIG. 8 is a box-plot of the edge roll-off after finish polish.

Dynamic slurry control was used to produce finish polished wafers with an edge roll-off target of −22 nm. The edge roll-off of the rough, double-side polished wafers was measured. The edge-roll off was used to vary the polishing slurry formula of the finish polish which caused a difference in the degree to which the edge roll-off of the finish polished wafers was changed. As shown in the box-plot of FIG. 7, dynamic slurry control caused wafers with an edge roll-off closer to 0 after double-side polishing to exhibit a greater change in edge roll-off after finish polishing. This allowed the finish polished wafers, across the double-side polish edge roll-off spectrum, to have an edge roll-off closer to the edge roll-off target of about −22 nm as shown in FIG. 8.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for polishing a semiconductor substrate having a front surface and a back surface generally parallel to the front surface, the method comprising:
   rough polishing a semiconductor substrate by contacting the semiconductor substrate with an abrasive slurry to produce a rough-polished semiconductor substrate;
   analyzing the rough-polished semiconductor substrate to measure the edge roll-off of the rough-polished semiconductor substrate, the rough-polished semiconductor substrate having a central axis, the edge roll-off being measured at a reference point, the distance between the central axis and the reference point being about 98.0% or more of the radius of the rough-polished semiconductor substrate;
   contacting a front surface of the rough polished semiconductor substrate or a front surface of a different semiconductor substrate with a polishing pad to finish polish the front surface;
   supplying a first polishing slurry comprising silica to the polishing pad at a first polishing slurry volume;
   supplying a second polishing slurry to the polishing pad at a second polishing slurry volume, the first and second polishing slurries being supplied to finish polish the front surface of the semiconductor substrate, the first polishing slurry comprising a higher concentration of silica relative to the second slurry; and
   controlling an amount of at least one of the first polishing slurry and the second polishing slurry supplied to the polishing pad as a whole during the finish polish based on the measured edge roll-off,
   wherein the amount of the at least one of the first polishing slurry and the second polishing slurry supplied to the polishing pad is controlled by controlling a ratio of the first polishing slurry volume to the second polishing slurry volume.

2. The method as set forth in claim 1 wherein the second polishing slurry comprises silica.

3. The method as set forth in claim 1 wherein the first polishing slurry and the second polishing slurry are separately supplied to the polishing pad.

4. The method as set forth in claim 1 wherein the ratio of the first polishing slurry volume to the second polishing slurry volume is reduced based on a measured increase in the edge roll-off the analyzed substrate.

5. The method as set forth in claim 1 wherein the second polishing slurry is supplied only after the first polishing slurry has been fully supplied.

6. The method as set forth in claim 1 wherein the amount of the at least one of the first polishing slurry and the second polishing slurry supplied to the polishing pad is the total amount of polishing slurry supplied while polishing at a first table of a polishing apparatus, the method comprising transferring the substrate to a second table of the polishing apparatus.

7. The method as set forth in claim 1 wherein the rough-polished semiconductor substrate that is analyzed is a first semiconductor substrate, the substrate that is finish polished is a second semiconductor substrate, the second semiconductor substrate being different from the first semiconductor substrate.

8. The method as set forth in claim 7 comprising polishing a plurality of substrates wherein one substrate is analyzed to adjust the amount of the at least one of the first polishing slurry and the second polishing slurry supplied to the polishing pad for a set of 100 or less substrates.

9. The method as set forth in claim 7 comprising polishing a plurality of substrates wherein one substrate is analyzed to adjust the amount of the at least one of the first polishing slurry and the second polishing slurry supplied to the polishing pad for a set of 25 or less substrates.

10. The method as set forth in claim 7 comprising polishing a plurality of substrates wherein one substrate is analyzed to adjust the amount of the at least one of the first polishing slurry and the second polishing slurry supplied to the polishing pad for a set of 10 or less substrates.

11. The method as set forth in claim 1 wherein the wafer that is finish polished is the wafer that is analyzed.

12. The method as set forth in claim 1 wherein rough polishing the semiconductor substrate comprises concurrently polishing the front and back surfaces of the semiconductor substrate, the semiconductor substrate being analyzed to determine an edge roll off of the semiconductor substrate after the front and back surfaces are concurrently polished, the semiconductor substrate not being further polished between the rough polish and the analysis of the substrate.

13. The method as set forth in claim 1 wherein the substrate has a diameter of about 300 mm and about 0.5 μm or less of material is removed from the front surface of the substrate.

14. The method as set forth in claim 1 wherein the first polishing slurry is mixed with another polishing slurry prior to supplying the first polishing slurry to the polishing pad.

15. The method as set forth in claim 1 wherein the amount of the at least one of the first polishing slurry and the second polishing slurry supplied to the pad is not adjusted beyond an amount that results in unacceptable degradation of wafer flatness.

16. The method as set forth in claim 1 wherein controlling a total amount of the at least one of the first polishing slurry and the second polishing slurry supplied to the polishing pad based on the measured edge roll-off causes the edge roll-off the substrate to be adjusted relative to a polishing process in which a total amount of the polishing slurry supplied to the polishing pad is not controlled, wherein the edge roll-off is defined by the following measurement protocol that is based on a thickness profile of the substrate:

forming a reference line between a first discrete point and a second discrete point on the thickness profile, the first discrete point and second discrete point each being a distance from the central axis of the substrate, the distance between the first discrete point and the central axis of the substrate being about 82.7% of the radius of the substrate and the distance between the second discrete point and the central axis of the substrate being about 93.3% of the radius of the substrate; and measuring a distance between the reference line and a third discrete point on the substrate thickness profile, the distance between the third discrete point and the central axis of the substrate being about 99.3% of the radius of the substrate.

17. The method as set forth in claim 1 wherein the rough polish reduces the surface roughness of the semiconductor substrate to less than about 3.5 Å as measured with an atomic force microscope at scan sizes of about 1 μm×about 1 μm to about 100 μm×about 100 μm and removes at least about 5 μm of material from the front surface of the semiconductor substrate.

\* \* \* \* \*